US011996150B2

United States Patent
Nam et al.

(10) Patent No.: US 11,996,150 B2
(45) Date of Patent: May 28, 2024

(54) NON-VOLATILE CONTENT ADDRESSABLE MEMORY DEVICE HAVING SIMPLE CELL CONFIGURATION AND OPERATING METHOD OF THE SAME

(71) Applicant: Samsung Electronics Co., Ltd., Suwon-si (KR)

(72) Inventors: Seunggeol Nam, Suwon-si (KR); Jinseong Heo, Seoul (KR); Taehwan Moon, Suwon-si (KR); Hagyoul Bae, Hanam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 69 days.

(21) Appl. No.: 17/540,675

(22) Filed: Dec. 2, 2021

(65) Prior Publication Data

US 2022/0351776 A1 Nov. 3, 2022

(30) Foreign Application Priority Data

Apr. 30, 2021 (KR) .......................... 10-2021-0056769

(51) Int. Cl.
*G11C 15/04* (2006.01)
(52) U.S. Cl.
CPC .................................. *G11C 15/046* (2013.01)
(58) Field of Classification Search
CPC .............................. G11C 15/046; G11C 15/46
(Continued)

(56) References Cited

U.S. PATENT DOCUMENTS 5,808,929 A * 9/1998 Sheikholeslami ... G11C 15/046
365/49.13
7,471,537 B1 * 12/2008 Park ....................... G11C 15/04
365/49.17

(Continued)

FOREIGN PATENT DOCUMENTS

| CN | 111128278 A | 5/2020 |
|---|---|---|
| KR | 10-1167272 B1 | 7/2012 |
| KR | 2019-0115521 A | 10/2019 |

OTHER PUBLICATIONS

Ni, Kai et al., "Ferroelectric ternary content-addressable memory for one-shot learning," Nature Electronics, vol. 2, p. 521-529, Nov. 2019.

(Continued)

*Primary Examiner* — Connie C Yoha
(74) *Attorney, Agent, or Firm* — Harness, Dickey & Pierce, P.L.C.

(57) ABSTRACT

Disclosed are a non-volatile content addressable memory device having a simple cell configuration and/or an operating method thereof. The non-volatile content addressable memory device includes a plurality of unit cells, wherein each of the plurality of unit cells consists of or includes a first ferroelectric transistor and a second ferroelectric transistor The first and second ferroelectric transistors are of different types such as different electrical types from each other. The first and second ferroelectric transistors may be connected in series or in parallel to each other. The first and second ferroelectric transistors may share one word line and one match line. The first and second ferroelectric transistors may share one search line. One of the first and second ferroelectric transistors may be connected to a search line and the other one may be connected to a bar search line. The first and second ferroelectric transistors may share one match line.

28 Claims, 11 Drawing Sheets

(58) Field of Classification Search
USPC .................................................... 365/49.13
See application file for complete search history.

(56) References Cited

U.S. PATENT DOCUMENTS

| | | | |
|---|---|---|---|
| 8,400,802 B2 | 3/2013 | Hong et al. | |
| 9,502,113 B2* | 11/2016 | Wang | G11C 15/046 |
| 10,804,295 B2 | 10/2020 | Yoo et al. | |
| 10,847,224 B1* | 11/2020 | Li | G11C 13/004 |
| 2002/0067632 A1* | 6/2002 | Batson | G11C 15/043 |
| | | | 365/49.17 |
| 2006/0067097 A1* | 3/2006 | Lien | G11C 11/22 |
| | | | 365/158 |
| 2019/0386142 A1* | 12/2019 | Gros-Jean | H01L 29/40111 |
| 2020/0006383 A1 | 1/2020 | Petti | |
| 2020/0194591 A1* | 6/2020 | Kim | H01L 27/088 |
| 2021/0142837 A1 | 5/2021 | Yu et al. | |
| 2022/0317935 A1* | 10/2022 | Advani | G06F 3/064 |
| 2023/0099577 A1* | 3/2023 | Heo | G11C 15/04 |
| | | | 365/49.1 |

OTHER PUBLICATIONS

Li, Can et al., "Analog content-addressable memories with memristors," Nature Communications, vol. 11, 1638, 2020.

* cited by examiner

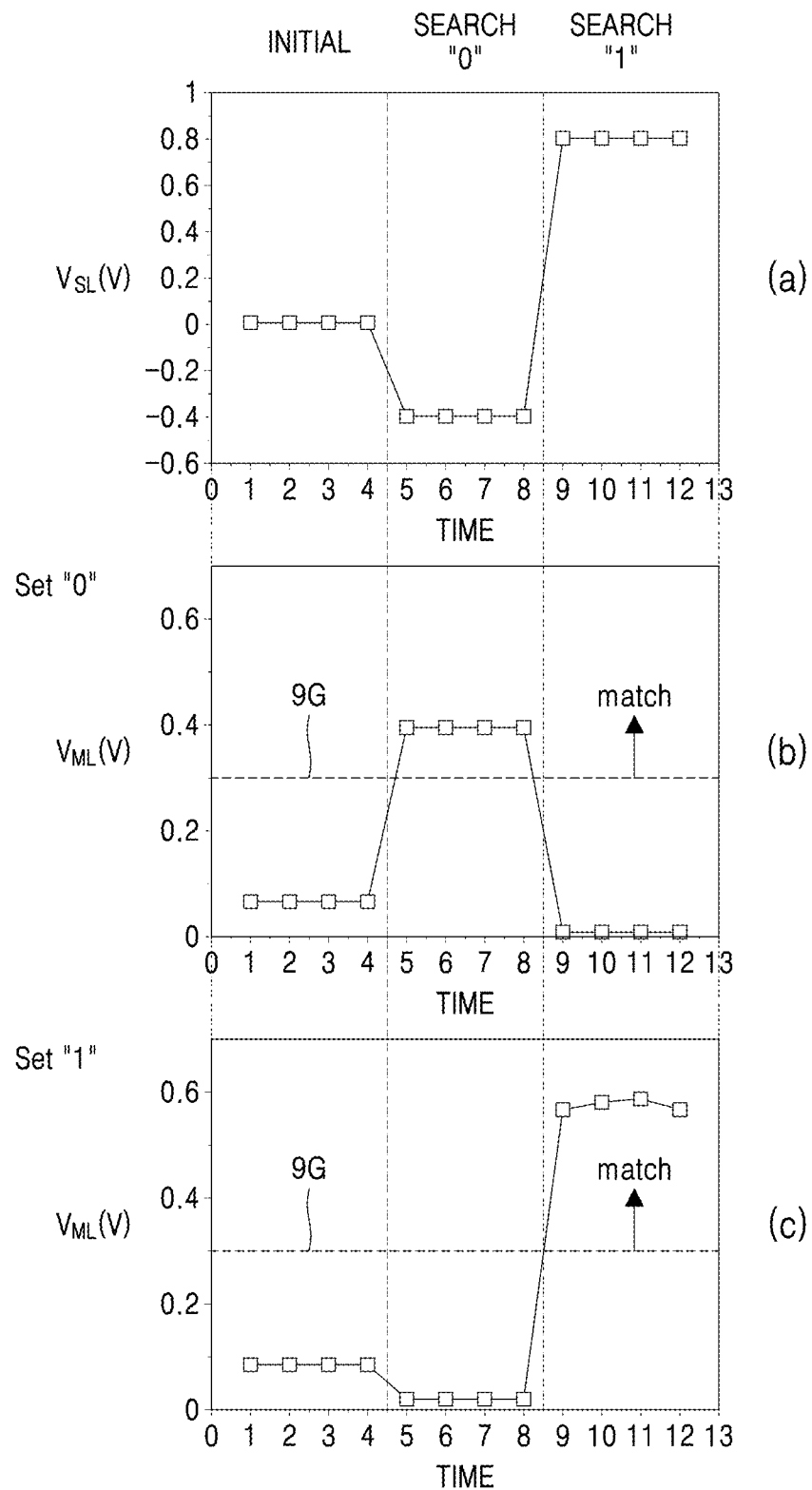

NON-VOLATILE CONTENT ADDRESSABLE MEMORY DEVICE HAVING SIMPLE CELL CONFIGURATION AND OPERATING METHOD OF THE SAME

CROSS-REFERENCE TO RELATED APPLICATION

This application is based on and claims priority under 35 U.S.C. § 119 to Korean Patent Application No. 10-2021-0056769, filed on Apr. 30, 2021, in the Korean Intellectual Property Office, the disclosure of which is incorporated by reference herein in its entirety.

BACKGROUND

Some example embodiments relate to memory devices, and more particularly, to non-volatile content addressable memory devices having a simple cell configuration and/or operating methods of the same.

A content addressable memory device or ternary content addressable memory (TCAM) generally includes static random access memory (SRAM). SRAM includes, for example, four (4T), six (6T), or up to sixteen (16T) transistors per cell, and has a volatile characteristic in that data is erased when the power supply is cut off. TCAM using SRAM may use 16 transistors/cell. Accordingly, an area of a unit cell is large. Accordingly, in order to reduce an area of a unit cell, a TCAM structure of a two-transistor/two resistor (2T-2R) using a resistive storage, such as Resistive RAM (ReRAM) or STT-MRAM, has been proposed. Recently, a TCAM structure using a ferroelectric transistor has been introduced.

SUMMARY

Provided are non-volatile content addressable memory devices with an increased degree of integration due to reduction of a cell size.

Alternatively or additionally, provided are operating methods of the non-volatile content addressable memory devices.

Additional aspects will be set forth in part in the description which follows and, in part, will be apparent from the description, and/or may be learned by practice of some example embodiments.

According to some embodiments, a non-volatile content addressable memory device includes a plurality of unit cells, wherein each of the plurality of unit cells consists of/includes a first ferroelectric transistor and a second ferroelectric transistor. The first and second ferroelectric transistors are of different types, e.g. of different electrical types from each other. In some examples, the first and second ferroelectric transistors may be connected in series or in parallel to each other. In some examples, the first and second ferroelectric transistors may share one word line and one match line. In some examples, the first and second ferroelectric transistors may be between the word line and the match line. In some examples, the first and second ferroelectric transistors may share one search line. In some examples, one of the first and second ferroelectric transistors may be connected to the search line, and the other one may be connected to a bar search line. In some examples, the first and second ferroelectric transistors may share one match line, and the match line may be connected between the first and second ferroelectric transistors. One of the first and second ferroelectric transistors may be connected to a word line. In some examples, the first and second ferroelectric transistors may be connected to one search line.

In some example embodiments, each of the first and second ferroelectric transistors may include: a substrate; first and second doped layers connected to the substrate and separated from each other; a ferroelectric layer arranged on the substrate between the first and second doped layers; and a gate layer arranged on the ferroelectric layer. In one example, the non-volatile content addressable memory device may further include a paraelectric layer having no ferroelectric characteristics and being arranged between the substrate and the ferroelectric layer. In one example, the non-volatile content addressable memory device may further include a channel layer between the substrate and the ferroelectric layer, wherein the first and second doped layers are part of the channel layer.

According to some example embodiments, an operating method of a non-volatile content addressable memory device including a plurality of unit cells is provided. The method includes: applying an operating voltage to each of the unit cells, wherein each of the unit cells consists of or includes two different types of ferroelectric transistors. In one example, the two ferroelectric transistors may share a match line. In one example, the two ferroelectric transistors may share a word line, the two ferroelectric transistors may be arranged between the match line and the word line, and a voltage may be applied to the match line. In one example, the two ferroelectric transistors may share a search line, and the applying the operating voltage may include applying a search voltage via the search line. In one example, each of the unit cells is connected to a search line and a bar search line, and the applying the operating voltage may include applying a search voltage via the search line and the bar search line. The match line may be connected between the two ferroelectric transistors, and a voltage may be applied to the match line. In one example, the two ferroelectric transistors may share a search line, and the applying the operating voltage may include applying a search voltage via the search line. In one example, the operating voltage may be a writing voltage, and the method may further include applying a search voltage.

According to some embodiments, a non-volatile content addressable memory device includes a plurality of unit cells. Each of the plurality of unit cells is a 2T-0R-0C cell and includes, a first ferroelectric transistor, and a second ferroelectric transistor.

In some example embodiments, the first ferroelectric transistor includes a first threshold adjust region having a first impurity concentration, and the second ferroelectric transistor includes a second threshold adjust region having a second impurity concentration different from the first impurity concentration. In some examples, a first gate length of the first ferroelectric transistor is different from a second gate length of the second ferroelectric transistor. In some examples, the first ferroelectric transistor is configured to operate in an enhancement mode, and the second ferroelectric transistor is configured to operate in a depletion mode. In some examples, the first and second ferroelectric transistors are of the same conductivity type.

BRIEF DESCRIPTION OF THE DRAWINGS

The above and other aspects, features, and/or advantages of some example embodiments will be more apparent from the following description taken in conjunction with the accompanying drawings, in which:

FIG. 9 is a graph for explaining a read operation of an operating method of a non-volatile content addressable memory device according to some example embodiments;

DETAILED DESCRIPTION OF SOME EXAMPLE EMBODIMENTS

Figure 1:
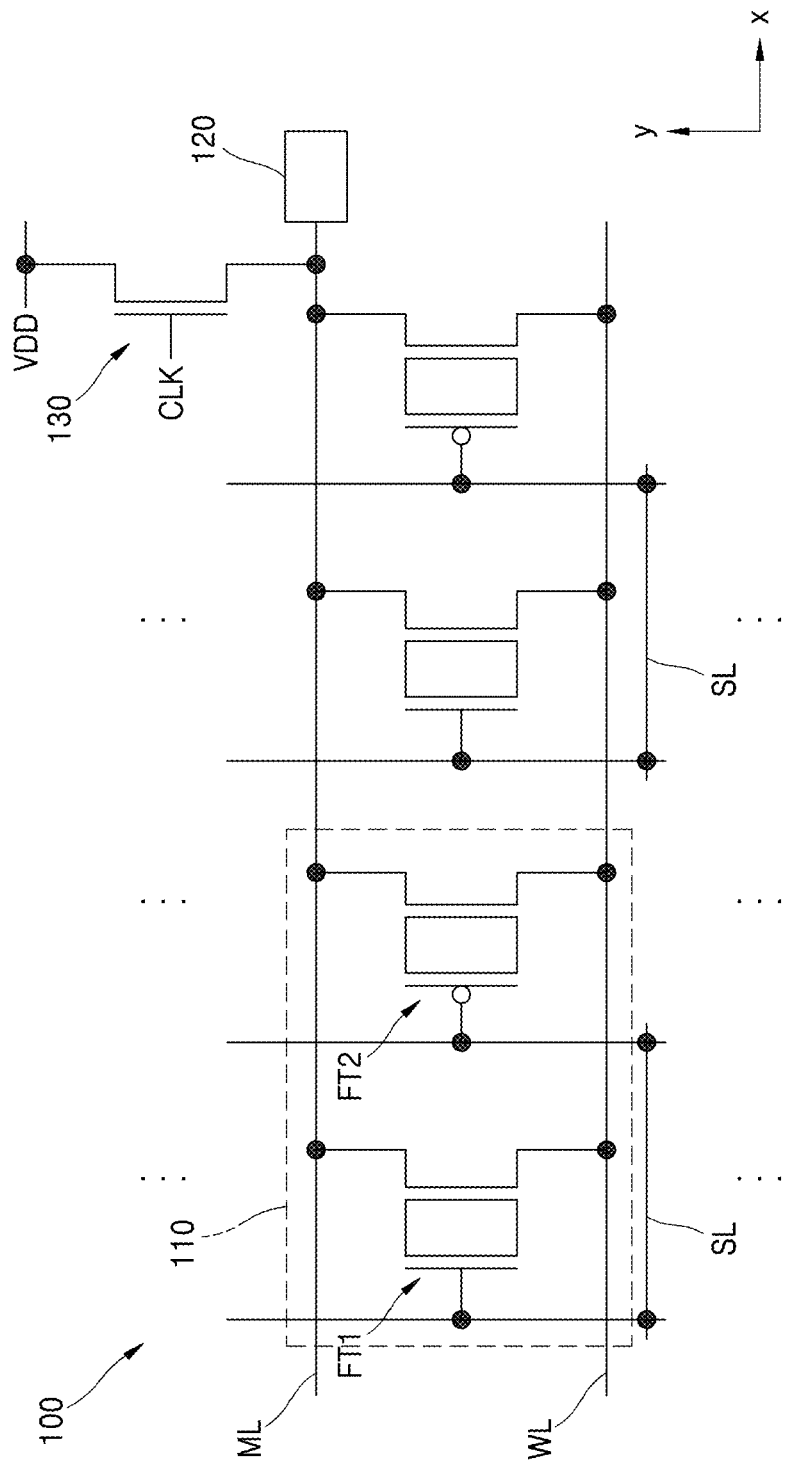
FIG. 1 is a circuit diagram illustrating a first non-volatile content addressable memory device according to an embodiment.

Reference will now be made in detail to some embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a non-volatile content addressable memory device having a simple cell configuration and/or an operation method thereof according to some example embodiments will be described in detail with reference to the accompanying drawings. In the drawings, thicknesses of layers and regions may be exaggerated for clarification of the specification. Some example embodiments of inventive concept are capable of various modifications and may be embodied in many different forms. It will be understood that when an element or layer is referred to as being "on" or "above" another element or layer, the element or layer may be directly on another element or layer or intervening elements or layers.

FIG. 1 is a circuit diagram illustrating a first non-volatile content addressable memory device 100 according to some example embodiments.

Referring to FIG. 1, the first non-volatile content addressable memory device 100 includes a plurality of unit cells 110. The unit cell 110 may be regarded as a unit memory device. In the first non-volatile content addressable memory device 100, the unit cell 110 may be repeated in a first direction and a second direction that may or may not be orthogonal to one another. The first direction may be an x-axis direction. The second direction may be a y-axis direction. In this way, the plurality of unit cells 110 may form a cell array, such as a rectangular array such as a square array or a hexagonal array a lattice array that is not rectangular. In one example embodiment, the unit cell 110 includes first and second ferroelectric transistors FT1 and FT2. Because the unit cell 110 includes a ferroelectric transistor, the first non-volatile content addressable memory device 100 may be referred to as a first ferroelectric content addressable memory device. In an example, the unit cell 110 may consist of, consist essentially of, or include a first ferroelectric transistor FT1 and a second ferroelectric transistor FT2. Here, the 'ferroelectric transistor' may be a ferroelectric field effect transistor. There may not be any other active device such as a transistor and/or a diode included in the unit cell 110. Alternatively or additionally, there may not be any other passive device such as a capacitor, a resistor, and inductor, or a memristor included in the unit cell 110. The unit cell 110 may be a volatile or non-volatile 2T-0R-0C unit cell corresponding to, or defined as, a two-transistor, zero resistor, zero capacitor unit cell.

Considering that a unit cell of a content addressable memory device of the related art includes three or more ferroelectric transistors or includes two or more transistors and other semiconductor devices (e.g., inverters and/or other transistors), the fact that the unit cell 110 consists of, consists essentially of, or includes two ferroelectric transistors FT1 and FT2 suggests that the size of the unit cell 110 may be reduced as much as the unit cell 110 consists of, consists essentially of, or includes two transistors, and may not include any other transistor and/or any other active and/or passive device. There may not be any other active device such as a transistor and/or a diode included in the unit cell 110. Alternatively or additionally, there may not be any other passive device such as a capacitor, a resistor, and inductor, or a memristor included in the unit cell 110.

Therefore, not only the first non-volatile content addressable memory device 100 but also non-volatile content addressable memory devices to be described later may be reduced in size, and accordingly, the degree of integration of the non-volatile content addressable memory device may be increased.

Continuing, the first and second ferroelectric transistors FT1 and FT2 of the unit cell 110 may be of different types from each other, e.g. of different electrical types from each other. In one example, the first ferroelectric transistor FT1 may be an NMOS type, and the second ferroelectric transistor FT2 may be a PMOS type. The first and second ferroelectric transistors FT1 and FT2 included in the unit cell 110 may share the first to third conductive wirings WL, ML, and SL. In one example, a first terminal, e.g., a source, of the first and second ferroelectric transistors FT1 and FT2 of the unit cell 110 may be connected to or directly connected to the first wiring WL, and a second terminal, e.g., a drain, may be connected to or directly connected to the second wiring ML. A third terminal, e.g., a gate of the first and second ferroelectric transistors FT1 and FT2 may be connected to or directly connected to the third wiring SL. The first wiring WL may be a word line. The second wiring ML may be a match line, e.g. a line used for matching content in the TCAM. The third wiring SL may be a search line, e.g. a line for searching for content in the TCAM. The first and second wirings WL and ML may be parallel to each other with the first and second ferroelectric transistors FT1 and FT2 therebetween. A portion of the third wiring SL connected to the gate may be perpendicular to the first and second wirings WL and ML. In the first non-volatile content addressable memory device 100, a sense amplifier 120 is connected to one end of the second wiring ML. A voltage signal transmitted through the second wiring ML may be amplified by the sense amplifier 120. A transistor 130 is connected to the second wiring ML between the sense amplifier 120 and the ferroelectric transistor FT2 adjacent to the sense amplifier 120. The transistor 130 may be a transistor that regulates a voltage between a power supply voltage VDD and the second wring ML.

The sense amplifier 120 may include transistors, such as a cross-coupled pair of planar NMOS and PMOS transistors (not illustrated); however, example embodiments are not limited thereto. The NMOS and PMOS transistors included in the sense amplifier 120 may or may not be ferroelectric transistors. Additionally or alternatively, the transistor 130 may or may not be a ferroelectric transistor. For example the transistor 130 may be a planar NMOS transistor and/or a planar PMOS transistor with or without a ferroelectric layer.

Additionally or alternatively, there may be contacts (not shown) such as low-resistive contacts connecting first wiring SL, the second wiring ML, and third wiring WL to terminals of each of the first ferroelectric transistor FT1 and second ferroelectric transistor FT2; however, example embodiments are not limited thereto. The contacts (not shown) may not be considered portions of the unit cell 100 and may be considered independent form the unit cell 100; however, example embodiments are not limited thereto. The contacts (not shown) may be considered portions of the first ferroelectric transistor FT1 and the second ferroelectric transistor FT2; however, example embodiments are not limited thereto.

Figure 2:
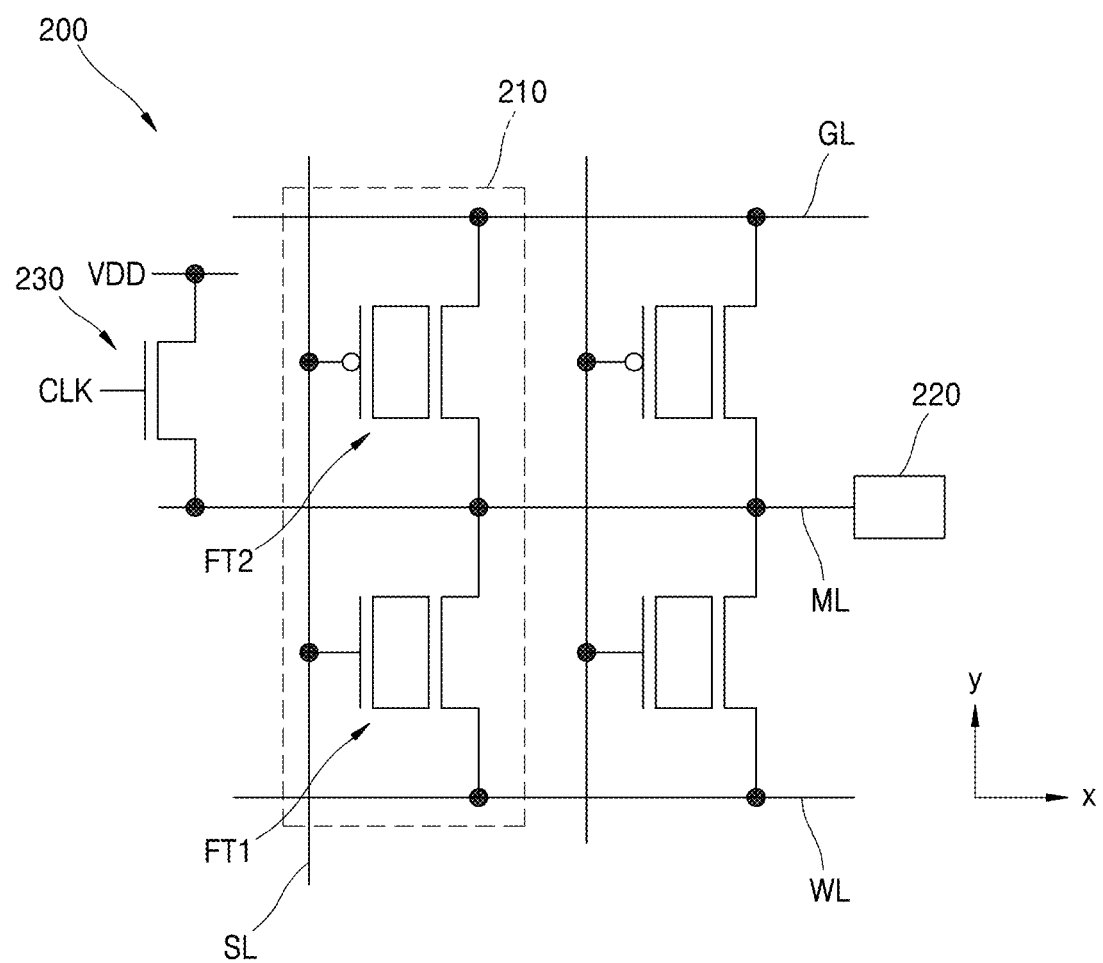
FIG. 2 is a circuit diagram illustrating a second non-volatile content addressable memory device according to some example embodiments.

FIG. 2 is a circuit diagram illustrating a second non-volatile content addressable memory device 200 according to some example embodiments. Hereinafter, the same reference numerals are used to indicate the same members as those mentioned in the description of the first non-volatile content addressable memory device 100.

Referring to FIG. 2, the second non-volatile content addressable memory device 200 includes a plurality of unit cells 210. The plurality of unit cells 210 may be aligned in the x-axis direction and the y-axis direction and may form an array, such as a rectangular or square array, a hexagonal array, or an array in a lattice that is not a rectangle. Each of the unit cells 210 may include first and second ferroelectric transistors FT1 and FT2. Each of the unit cells 210 may include only the first and second ferroelectric transistors FT1 and FT2 as a semiconductor device, and may not include other transistors and/or other active and/or passive components. The first and second ferroelectric transistors FT1 and FT2 of the unit cell 210 may be connected in series in the y-axis direction. The first wiring WL is connected to or directly connected to a first terminal, e.g., a source, of the first ferroelectric transistor FT1. A fourth wiring GL is connected to or directly connected to the first terminal, e.g., the source, of the second ferroelectric transistor FT2. The fourth wiring GL may be a ground line. The second wiring ML is connected to or directly connected to a second terminal, e.g., a drain, of the first and second ferroelectric transistors FT1 and FT2. The second wiring ML is shared by the first and second ferroelectric transistors FT1 and FT2 of each of the unit cells 210. The second wiring ML of each of the unit cells 210 may be positioned between the first and second ferroelectric transistors FT1 and FT2 and may be parallel to the x-axis. The first and fourth wirings WL and GL may be parallel to the second wiring ML. In the unit cell 210, third terminals, e.g., gates, of the first and second ferroelectric transistors FT1 and FT2 may be connected to or directly connected to each other by the third wiring SL. The third wiring SL may be parallel to the y-axis. Accordingly, the third wiring SL may be perpendicular to the first, second, and fourth wirings WL, ML, and GL. In the operation of the second non-volatile content addressable memory device 200, a writing (recording) voltage and a read (search) voltage may be applied through the third wiring SL. The writing voltage may be greater, e.g. greater in absolute value, than the reading voltage; however, example embodiments are not limited thereto. The unit cell 210 may be selected by selecting the first wiring WL and the third wiring SL. The sense amplifier 220 is connected to or directly connected to one side of the second wiring ML and a transistor 230 is connected to or directly connected to the other side of the second wiring ML. For example, a plurality of unit cells 210 are arranged between the sense amplifier 220 and the transistor 230. The transistor 230 is located between the power supply voltage VDD and the second wiring ML, and is connected to them. The sense amplifier 220 may be the same as the sense amplifier 120 of FIG. 1; however, example embodiments are not limited thereto. The transistor 230 may also be the same as the transistor 130 of FIG. 1; however, example embodiments are not limited thereto.

Figure 3:
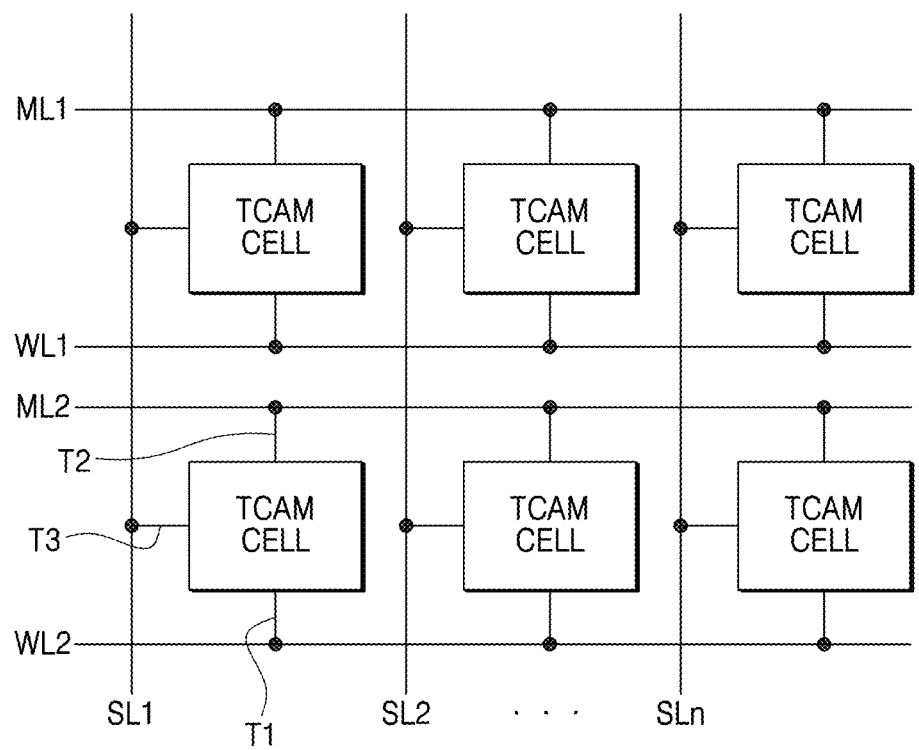
FIG. 3 is a circuit diagram illustrating a memory cell array including a plurality of unit cells of FIG. 1 or a plurality of unit cells of FIG. 2.

FIG. 3 is a circuit diagram illustrating a memory cell array including the plurality of unit cells 110 of the first non-volatile content addressable memory device 100 or the plurality of unit cells 210 of the second non-volatile content addressable memory device 200.

In FIG. 3, "TCAM Cell" indicates a unit cell, and may correspond to the unit cell 110 of FIG. 1 or the unit cell 210 of FIG. 2. Referring to FIG. 3, each TCAM cell has first to third terminals T1 to T3. Each TCAM cell may not have any other terminals. The first terminal T1 is connected to or directly connected to the word lines WL1 and WL2. The second terminal T2 is connected to or directly connected to the match lines ML1 and ML2. The third terminal T3 is connected to or directly connected to the search lines SL1, SL2 . . . SLn. The word lines WL1 and WL2 and the match lines ML1 and ML2 may be parallel to each other. The search lines SL1, SL2 . . . SLn may be perpendicular to the word lines WL1 and WL2 and the match lines ML1 and ML2.

Figure 4:
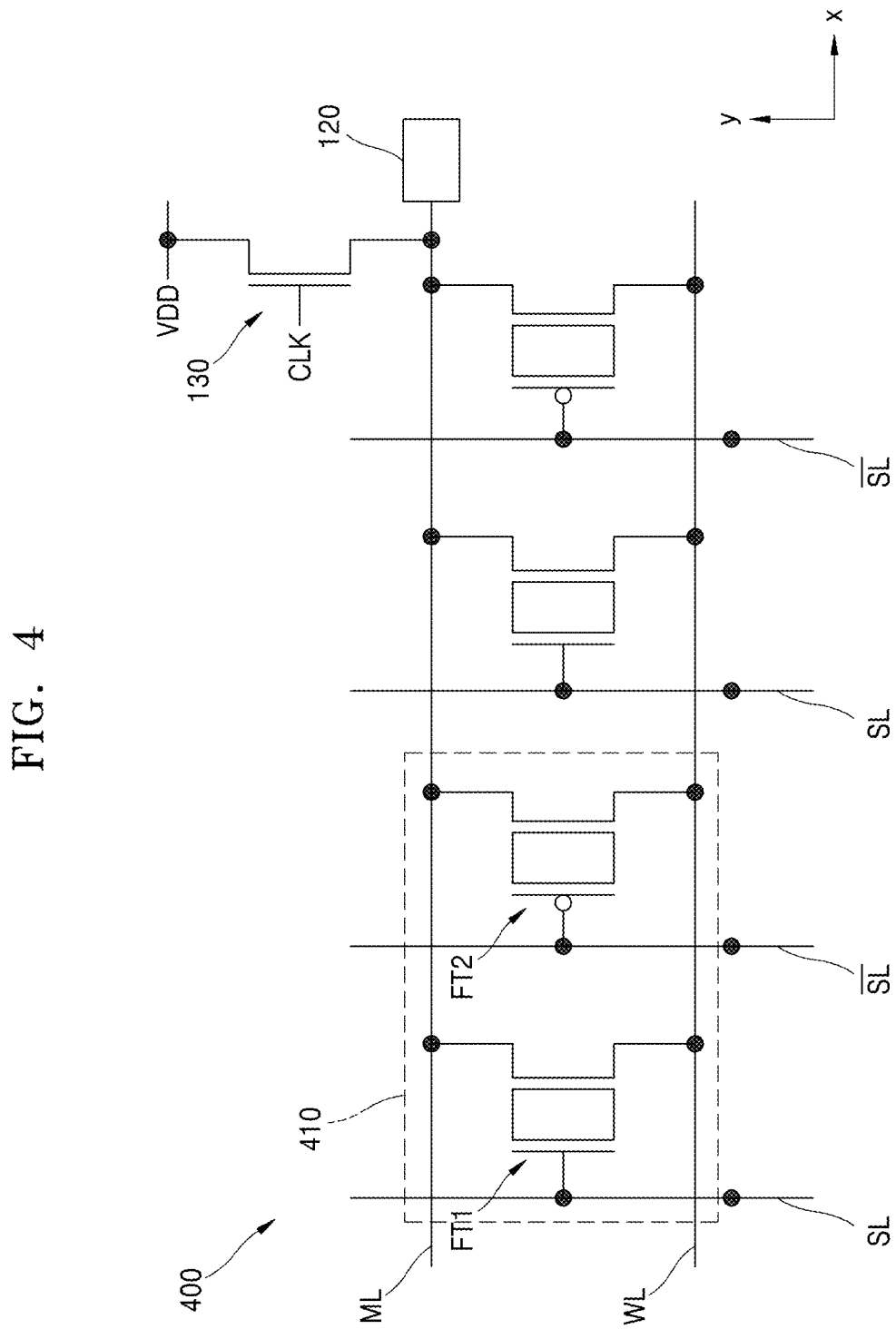
FIG. 4 is a circuit diagram illustrating a third non-volatile content addressable memory device according to some example embodiments.

FIG. 4 is a circuit diagram illustrating a third non-volatile content addressable memory device 400 according to some example embodiments. Only parts different from the first non-volatile content addressable memory device 100 will be described.

Referring to FIG. 4, the third non-volatile content addressable memory device 400 includes a plurality of unit cells 410. The configuration of each of the unit cells 410 may be the same as or similar to that of the unit cell 110 of the first non-volatile content addressable memory device 100. A third wiring SL is connected to a gate that is a third terminal of the first ferroelectric transistor FT1 of the unit cell 410.

A fifth wiring, e.g. a complimentary wiring SL bar is connected to or directly connected to the gate which is the third terminal of the second ferroelectric transistor FT2. The third wiring SL and the fifth wiring SL bar are separated from each other and are parallel to each other. The third and fifth wirings SL and SL bars may be designed to be perpendicular to the first and second wirings WL and ML. The fifth wiring SL bar may be a bar line, e.g. a complimentary line, with respect to the third wiring SL. Accordingly, a voltage applied to the fifth wiring SL bar may have the same magnitude as a voltage applied to the third wiring SL, but may have an opposite sign. For example, in a writing operation, when a positive first writing voltage is applied to the first ferroelectric transistor FT1 through the third wiring SL, a negative second writing voltage may be applied to the second ferroelectric transistor FT2 through the fifth wiring SL bar. In this case, absolute values of the first and second writing voltages may be the same.

Alternatively or additionally, when a voltage corresponding to a logical "1" is applied to third wiring SL, a voltage corresponding to a logical "0" may be applied to fifth wiring SL bar. When a voltage corresponding to a logical "0" is applied to third wiring SL, a voltage corresponding to a logical "1" may be applied to the fifth wiring SL bar.

Figure 5:
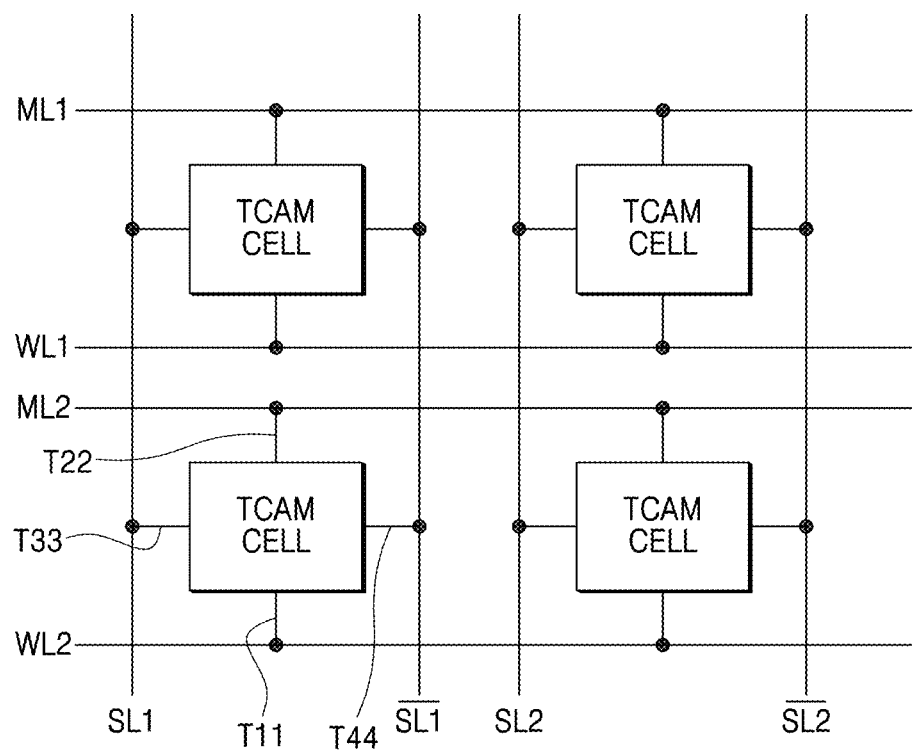
FIG. 5 is a circuit diagram illustrating a cell array including a plurality of unit cells of the third non-volatile content addressable memory device of FIG. 4.

FIG. 5 is a circuit diagram illustrating a cell array including the plurality of unit cells 410 of the third non-volatile content addressable memory device 400 of FIG. 4. In FIG. 5, it is depicted that the cell array includes only four unit cells TCAM Cells for convenience, but the cell array may include four or more unit cells. The unit cell TCAM Cell of FIG. 5 represents the unit cell 410 of FIG. 4.

Referring to FIG. 5, the plurality of unit cells TCAM Cells are arranged in a lattice form. Each of the unit cells TCAM Cells has first to fourth terminals T11, T22, T33, and T44, and may not have any additional terminals. The first terminal T11 is connected to the word lines WL1 and WL2. The second terminal T22 is connected to the match lines ML1 and ML2. The third terminal T33 is connected to the search lines SL1 and SL2. The fourth terminal T44 is connected to the bar search lines SL1 bar and SL2 bar. Each of the unit cells TCAM Cells is located between the word lines WL1 and WL2 and the match lines ML1 and ML2 in the first direction. In addition, each of the unit cells TCAM Cells is located between the search lines SL1 and SL2 and the bar search lines SL1 bar and SL2 bar in a second direction perpendicular to the first direction. For example, the word lines WL1 and WL2 and the match lines ML1 and ML2 are located on both sides of each unit cell TCAM Cell in the first direction and are parallel to each other, and the search lines SL1 and SL2 and the bar search lines SL1 bar and SL2 bar are located on both sides of each unit cell TCAM Cell in the second direction and are parallel to each other. The search lines SL1 and SL2 correspond to the third wiring SL of FIG. 4, and the bar search lines SL1 bar and SL2 bar correspond to the fifth wiring SL bar of FIG. 4.

Figure 6:
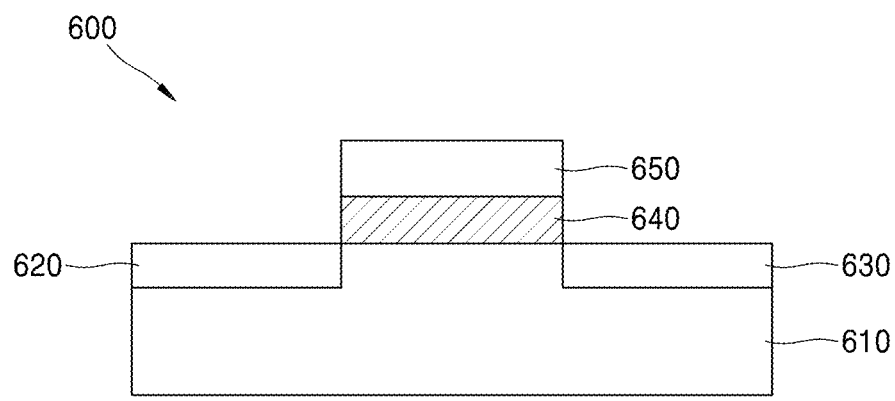
FIG. 6 is a cross-sectional view illustrating an example of first and second ferroelectric transistors included in a unit cell of the non-volatile content addressable memory device of FIG. 1, 2, or 4.

FIG. 6 shows an example of the first and second ferroelectric transistors FT1 and FT2 included in the unit cells 110, 210, and 410 of the first to third non-volatile content addressable memory devices 100, 200, and 400.

Referring to FIG. 6, a ferroelectric transistor 600 may include a substrate 610, first and second doped layers 620 and 630, a ferroelectric layer 640, and a gate layer 650. The first and second doped layers 620 and 630 are separated from each other. In one example, the first and second doped layers 620 and 630 may be layers formed by implanting one or more dopants into portions of the substrate 610. The one or more dopants may be different depending on the doping type of the substrate 610. In some example embodiments, the substrate 610 may be or may include a p-type semiconductor substrate doped (e.g. lightly doped) with a p-type conductive impurity such as boron and/or a material layer exhibiting a p-type semiconductor characteristic, and the first and second doped layers 620 and 630 may be layers doped with, e.g. highly doped with, an n-type conductive impurity such as at least one of phosphorus and/or arsenic. Example embodiments are not limited thereto. The first and second doped layers 620 and 630 may be doped with the same type conductivity impurity. When the substrate 610 and the first and second doped layers 620 and 630 are the same as described above, the ferroelectric transistor 600 may be an NMOS type ferroelectric transistor, and may correspond to the first ferroelectric transistor FT1. In one example, the substrate 610 may be an n-type semiconductor substrate doped with an n-type conductive impurity (n-type dopant such as phosphorus and/or arsenic) and/or a material layer exhibiting an n-type semiconductor characteristic, and the first and second doped layers 620 and 630 may be layers doped with a p-type conductive impurity (a p-type dopant such as boron). When the substrate 610 and the first and second doped layers 620 and 630 are the same as described above, the ferroelectric transistor 600 may be a PMOS type ferroelectric transistor, and may correspond to the second ferroelectric transistor FT2. One of the first and second doped layers 620 and 630 may be or correspond to a source layer or a source electrode, and the other may be a drain layer or a drain electrode. In one example, the first and second doped layers 620 and 630 may be layers formed on the substrate 610 according to the type of the substrate 610.

Example embodiments are not limited thereto. For example, the substrate 610 may be undoped or may be only lightly doped with impurities. There may be a channel region (not illustrated) and/or a well region (not illustrated) of opposite conductivity type to that of either the first or second doped layers 620 and 630. Alternatively or additionally either or both of the first and second doped layers may be doped with an impurity such as carbon.

The ferroelectric layer 640 and the gate layer 650 are sequentially stacked on the substrate 610 between the first doped layer 620 and the second doped layer 630. The ferroelectric layer 640 may be or may include or correspond to a gate insulating layer or may be included in or incorporated in the gate insulating layer. The ferroelectric layer 640 may contact or directly contact the first and second doped layers 620 and 630. When a separate channel layer or region (not shown) is formed or implanted between the ferroelectric layer 640 and the substrate 610, the first and second doped layers 620 and 630 may be conductive layers formed on the channel layer, and the channel layer under the conductive layer may be doped with n-type or p-type dopants. When the channel layer is provided, the conductive layer and the ferroelectric layer 640 may be separated from each other. The ferroelectric layer 640 may cover the entire upper surface of the substrate 610 between the first and second doped layers 620 and 630. The gate layer 650 may be a gate electrode, may directly contact the ferroelectric layer 640, and may cover the entire upper surface of the ferroelectric layer 640.

In some example embodiments, the substrate 610 may include a semiconductor layer, a two-dimensional material layer, or a quantum dot layer. In some example embodiments, the semiconductor layer may include an inorganic semiconductor layer or an organic semiconductor layer. In an example, the inorganic semiconductor layer may include a silicon (Si) layer, a germanium (Ge) layer, or a compound semiconductor layer. In some example embodiments, the compound semiconductor layer may include a thin film semiconductor layer or a Group III-V compound semiconductor layer. In one example, the thin film semiconductor layer may include an oxide semiconductor layer. In one example, the oxide semiconductor layer may include an IGZO layer. In an example, the organic semiconductor layer may include a P$_3$HT layer, a PQT layer, and/or a pBTTT layer. In an example, the two-dimensional material layer may include a carbon-including layer and/or a transition metal dichalcogenide (TMD) layer. In some example embodiments, the carbon-including layer may include a carbon nanotube layer or a graphene layer. In some example embodiments, the quantum dot layer may be a layer including colloidal QDs and/or a layer including nanocrystals.

In some example embodiments, the ferroelectric layer 640 may include a material layer having a thickness exhibiting ferroelectric characteristics. In some example embodiments, the ferroelectric layer 640 may include an oxide layer exhibiting ferroelectric characteristics. In some example embodiments, the oxide layer exhibiting the ferroelectric characteristics may include an oxide layer including hafnium (Hf) or zirconium (Zr). In some example embodiments, the oxide layer exhibiting the ferroelectric characteristics may include a dopant. In some example embodiments, the dopant may include one of Si, Al, Y, La, Gd, Sr, and Hf. The gate layer 650 may include at least one of a metal layer, a metal nitride layer, a polysilicon layer, or a two-dimensional conductive layer. In some example embodiments, the two-dimensional conductive layer may be a graphene layer or a carbon nanotube layer, or may include graphene or a carbon nanotube.

Figure 7:
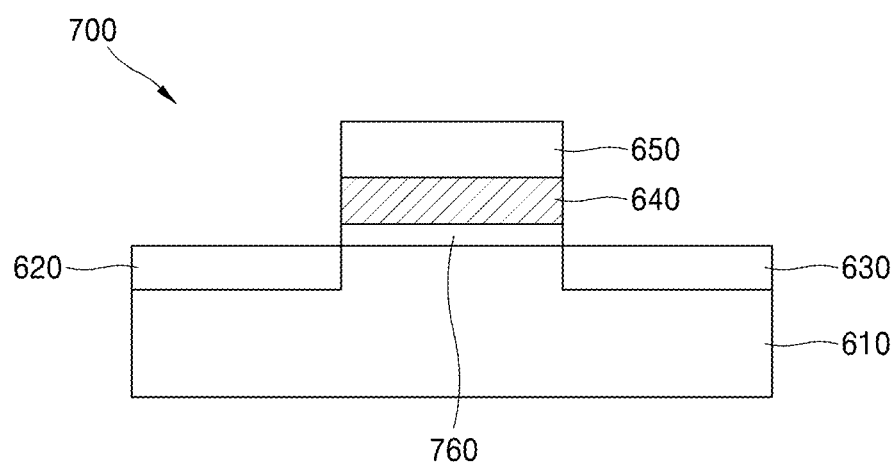
FIG. 7 is a cross-sectional view illustrating another example of the first and second ferroelectric transistors included in the unit cell of the non-volatile content addressable memory device of FIG. 1, 2, or 4.

FIG. 7 shows another example of the first and second ferroelectric transistors FT1 and FT2 included in the unit cells 110, 210, and 410 of the first to third non-volatile content addressable memory devices 100, 200, and 400. Only parts different from the ferroelectric transistor 600 of FIG. 6 will be described.

Referring to FIG. 7, the ferroelectric transistor 700 includes a paraelectric layer 760 between the ferroelectric layer 640 and the substrate 610. For example, the paraelectric layer 760, the ferroelectric layer 640, and the gate layer 650 are sequentially stacked on the substrate 610 between the first and second doped layers 620 and 630. The paraelectric layer 760 and the ferroelectric layer 640 may be or may include a gate insulating layer or may be included in the gate insulating layer. The paraelectric layer 760 is a dielectric layer having no ferroelectric characteristics, and may include one of or at least one of a silicon oxide layer, a silicon nitride layer, a silicon oxynitride layer, and an aluminum oxide layer. For example, the paraelectric layer 760 may be a single layer or a multilayer. In some example embodiments, the silicon oxide layer may include a SiO layer (e.g., a SiO$_2$ layer). In some example embodiments, the silicon nitride layer may include a SiN layer (e.g., a Si$_3$N$_4$ layer). In some example embodiments, the silicon oxynitride layer may include a SiON layer. In some example embodiments, the aluminum oxide layer may include an AlO layer (e.g., an Al$_2$O$_3$ layer).

Figure 8A:
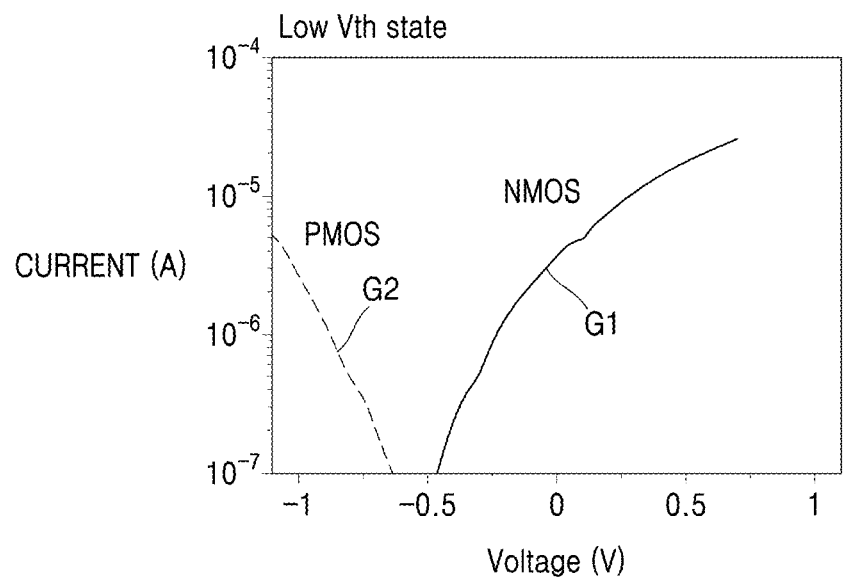
FIGS. 8A and 8B area graphs showing current-voltage characteristics of first and second ferroelectric transistors of unit cells when data 0 is written and when data 1 is written to a unit cells of the non-volatile content addressable memory device of FIG. 1, 2, or 4.
Figure 8B:
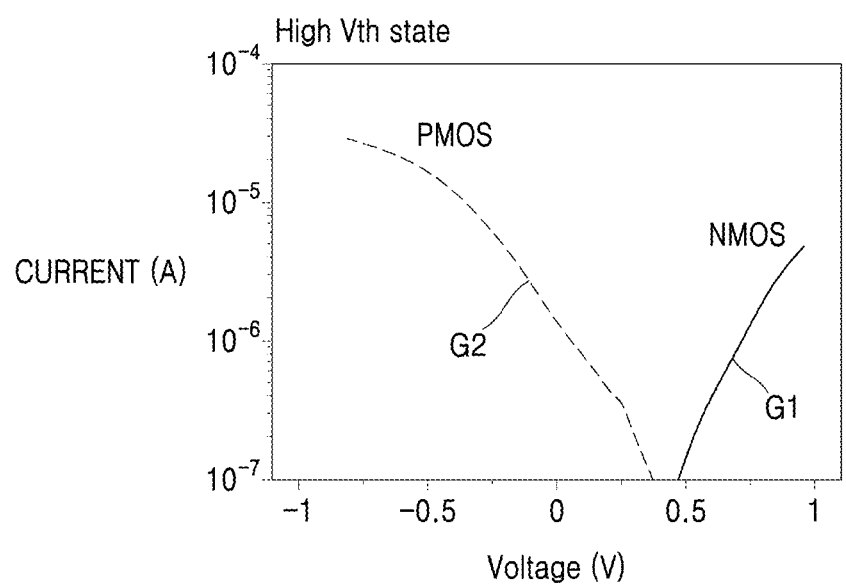

FIGS. 8A and 8B are graphs showing current-voltage characteristics of the first and second ferroelectric transistors FT1 and FT2 of the unit cells 110, 210, and 410 when logical data "0" is written and when logical data "1" is written to the unit cells 110, 210, and 410 of the first to third non-volatile content addressable memory devices 100, 200, and 400. The operation of writing data "0" or "1" may include an operation of applying a negative voltage or a positive voltage to the search line SL of the unit cells 110, 210, and 410.

FIG. 8A shows current-voltage characteristics of the first and second ferroelectric transistors FT1 and FT2 when data "0" is written, For example, the unit cells 110, 210, and 410 are in a low threshold voltage state (low Vth state). FIG. 8B shows current-voltage characteristics of the first and second ferroelectric transistors FT1 and FT2 when data "1" is written, that is, in a high threshold voltage state (high Vth state). In FIGS. 8A and 8B, the horizontal axis represents voltage and the vertical axis represents current. Also, in FIGS. 8A and 8B, the first graph G1 shows the current-voltage characteristics of an NMOS type ferroelectric transistor, that is, the first ferroelectric transistor FT1, and the second graph G2 shows the current-voltage characteristics of a PMOS type ferroelectric transistor, that is, the second ferroelectric transistor FT2.

Referring to FIG. 8A, the threshold voltage is a negative voltage. In the NMOS type ferroelectric transistor, a current increases as the voltage increases in a positive voltage direction (G1), and in the PMOS type ferroelectric transistor, a current also increases as the voltage increases in a negative voltage direction (G2). Referring to FIG. 8B, the threshold voltage is a positive voltage greater than 0 V. In the NMOS type ferroelectric transistor, a current increases as the voltage increases in the positive voltage direction (G1), and, in the PMOS type ferroelectric transistor, a current also increases as the voltage increases in the negative voltage direction (G2).

FIG. 9 is a graph for explaining a read operation of an operating method of a non-volatile content addressable memory device according to some example embodiments. The read operation may be an operation for searching data. In portions (a), (b) and (c) of FIG. 9, the horizontal axis represents time and the vertical axis represents voltage, respectively.

Portion (a) of FIG. 9 shows a voltage applied to the search line SL according to time in a read operation. Portion (b) of FIG. 9 shows a voltage at a match line according to the search operation shown in portion (a) of FIG. 9 when data 0 is written to the unit cells 110, 210, and 410. Portion (c) of FIG. 9 shows a voltage at the match line according to the search operation shown in portion (a) of FIG. 9 when data 1 is written to the unit cells 110, 210, and 410. In portions (b) and (c) of FIG. 9, reference numeral 9G denotes a reference voltage or a set voltage for determining whether data is matched or not. In some example embodiments, the reference voltage may be about 0.3V.

In the search operation of FIG. 9, the transistor 130 of the non-volatile content addressable memory device may be in a turned-on state.

In a data search operation, when a voltage applied to the search line of each unit cell 110, 210, and 410 is 0V, regardless of data stored in each unit cell 110, 210, 410, a voltage at a match line ML connected to the first and second ferroelectric transistors FT1 and FT2 maintains a voltage lower than the reference voltage.

In order to search for data "0", a first voltage (e.g., a negative voltage) is applied to the search line SL of each unit cell 110, 210, and 410 (first operation). In this case, when the data written to the unit cells 110, 210, and 410 is "0", the first and second ferroelectric transistors FT1 and FT2 of each of the unit cells 110, 210, and 410 are in an off-state according to the current-voltage characteristic of FIGS. 8A and 8B, and accordingly, as shown in portion (b) of FIG. 9, the voltage at the match line ML is measured to be higher than the reference voltage. The voltage at the match line ML may be measured by the sense amplifier 120. When the data written to the unit cells 110, 210, and 410 in the first operation is "1", according to the current-voltage characteristic of FIGS. 8A and 8B, the second ferroelectric transistor FT2 which is a PMOS type of each of the unit cells 110, 210, and 410 is in a turned-on state, and a voltage of the match line ML flows through the second ferroelectric transistor FT2. Accordingly, the voltage flowing through the match line ML is lower than the reference voltage as shown in portion (c) of FIG. 9.

As a result, when the voltage of the match line ML measured through the sense amplifier 120 in the first operation is greater than the reference voltage, the data written in the unit cells 110 210, and 410 is determined to be data "0". For example, it is determined that there is data to be found in the unit cells 110, 210, and 410.

Next, in order to search for data "1", a second voltage (e.g., a positive voltage) may be applied to the search line SL of the unit cells 110, 210, and 410 (a second operation). When the data written in the unit cells 110, 210, and 410 in the second operation is "0", the first dielectric transistor FT1 of each of the unit cells 110, 210, and 410 is in a turned-on state according to the current-voltage characteristic shown in FIG. 8A. Accordingly, as a voltage at the match line ML flows through the first ferroelectric transistor FT1, the voltage at the match line ML is measured to be lower than the reference voltage as shown in portion (b) of FIG. 9. When the data written in the unit cells 110, 210, and 410 in the second operation is 1, the first and second ferroelectric transistors FT1 and FT2 of the unit cells 110, 210, 410 are in a turned-off state according to the current-voltage characteristic shown in FIG. 8B. Accordingly, the voltage at the match line ML is measured to be higher than the reference voltage as shown in portion (c) of FIG. 9.

As a result, in the second operation, when the voltage of the match line ML measured through the sense amplifier 120 is greater than the reference voltage, the data written in the unit cells 110, 210, and 410 is determined to be data "1". That is, it is determined that there is data to be found in the unit cells 110, 210, and 410.

Figure 10:
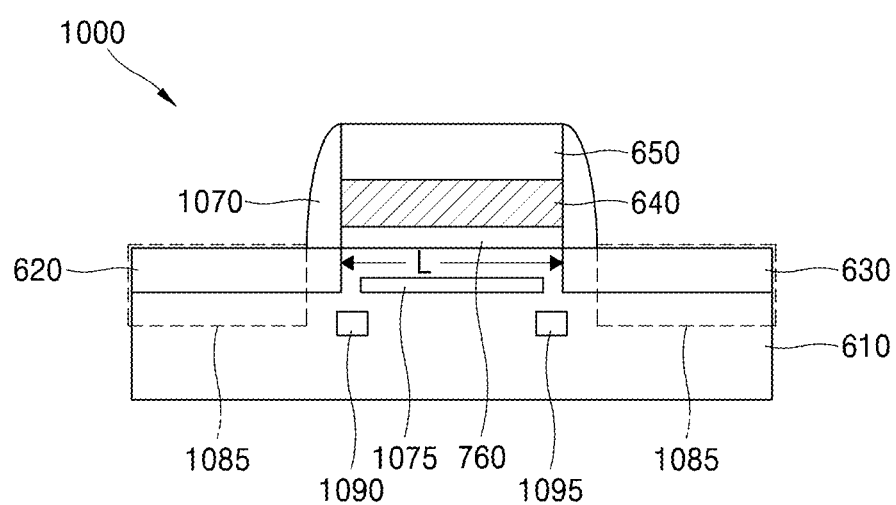
FIG. 10 is a cross-sectional view illustrating another example of the first and second ferroelectric transistors included in the unit cell of the non-volatile content addressable memory device of FIG. 1, 2, or 4.

FIG. 10 shows another example of the first and second ferroelectric transistors FT1 and FT2 included in the unit cells 110, 210, and 410 of the first to third non-volatile content addressable memory devices 100, 200, and 400. Only parts different from the ferroelectric transistor 700 of FIG. 7 will be described.

Referring to FIG. 10, the ferroelectric transistor 1000 includes a spacer region 1070, first and second highly doped regions 1080 and 1085, threshold adjust region 1075, and first and second pocket regions 1090 and 1095.

A gate length L of the ferroelectric transistor 1000 may be determined by a channel length between first and second doped layers 620 and 630. The highly doped regions 1080 and 1085 may be doped with the same conductivity type as the first and second doped layers 620 and 630 and at a higher concentration than either or both of the first and second doped layers 620 and 630; however, example embodiments are not limited thereto. Additionally or alternatively, the first and second pocket regions 1090 and 1095 may be doped with impurities of opposite conductivity type than either or both of the first and second doped layers 620 and 630; however, example embodiments are not limited thereto. Additionally or alternatively, the threshold adjust region 1075 may have dopants of the same, or different, conductivity types and/or concentrations than either or both of the first and second doped layers 620 and 630; however, example embodiments are not limited thereto.

Each of, or at least some of, the gate length L, a dopant concentration in the first and second highly doped regions 1080 and 1085, a dopant concentration in the threshold adjust region 1075, and a dopant concentration in the first and second pocket regions 1090 and 1095 may determine or be a factor in an electrical type, e.g. in many electrical properties of the ferroelectric transistor 1000, such as but not limited to, at least one of a threshold voltage, an on-state current, a subthreshold voltage and/or subthreshold swing, etc.

For example, according to some example embodiments, the first ferroelectric transistor FT1 may correspond to a first ferroelectric transistor 1000 operating with a first impurity concentration in the respective one of the first and second highly doped regions 1080 and 1085, the threshold adjust region 1075, and the first and second pocket regions 1090 and 1095, and the second ferroelectric transistor FT2 may correspond to a second ferroelectric transistor 1000 with a second impurity concentration in the respective one of the first and second highly doped regions 1080 and 1085, the threshold adjust region 1075, and the first and second pocket regions 1090 and 1095. For example, the first ferroelectric transistor 1000 may operate in a depletion mode, and the second ferroelectric transistor 1000 may operate in an enhancement mode; however, example embodiments are not limited thereto.

Alternatively or additionally, both the first and second ferroelectric transistors 1000 may be of the same conductivity type, but have other, different electrical properties. For example, both the first and second ferroelectric transistors 1000 may be NMOS transistors (or both PMOS transistors), but may have different electrical properties based, for example, on impurity concentrations of dopants included in any of or all of the of the first and second highly doped regions 1080 and 1085, the threshold adjust region 1075, and the first and second pocket regions 1090 and 1095; however, example embodiments are not limited thereto.

Figure 11:
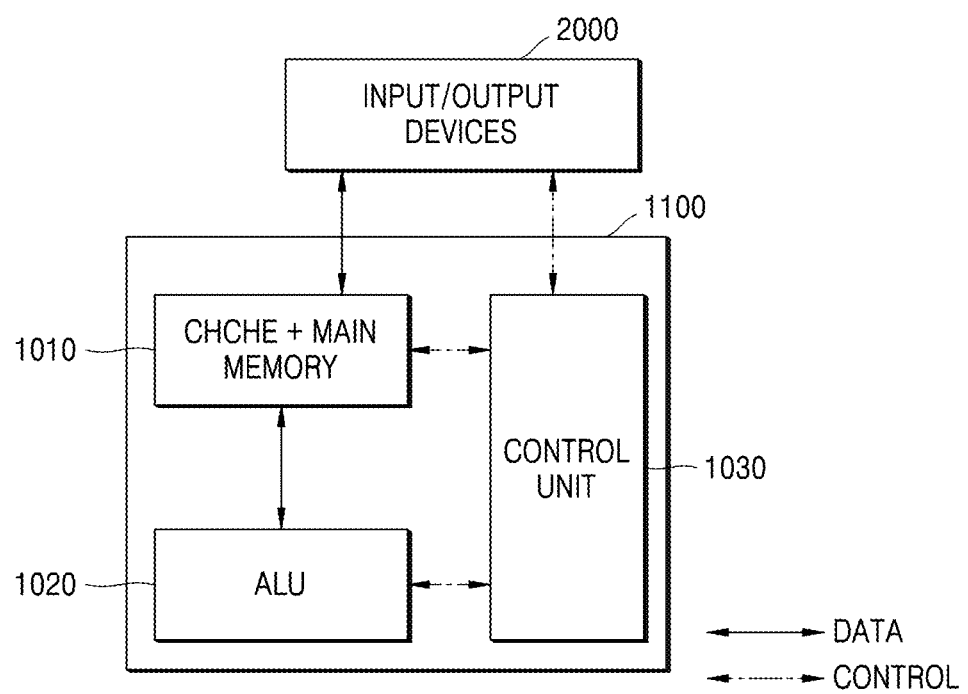
FIGS. 11 and 12 are conceptual views schematically showing an electronic device architecture applicable to an electronic apparatus, according to some example embodiments.
Figure 12:
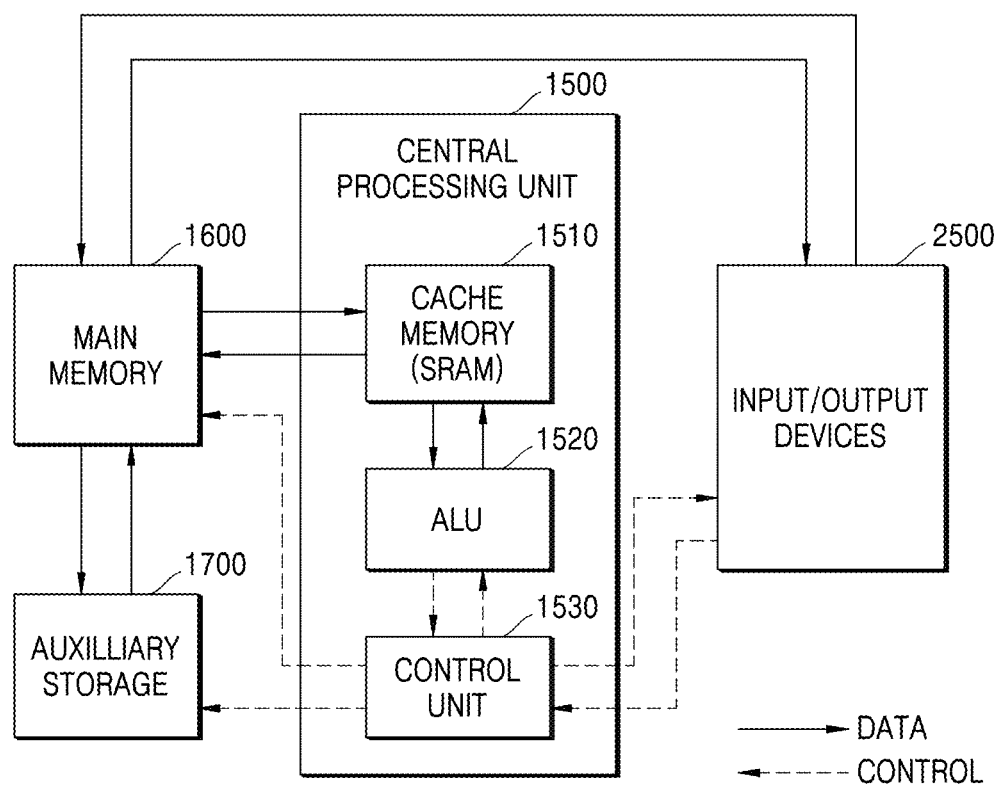

FIGS. 11 and 12 are conceptual views schematically showing an electronic device architecture 1100 applicable to an electronic apparatus having an array of unit cells 100, according to some example embodiments.

Referring to FIG. 11, the electronic device architecture 1100 may include a memory unit 1010, an arithmetic logic unit (ALU) 1020, and a control unit 1030. The memory unit 1010, the ALU 1020, and the control unit 1030 may be electrically connected to each other. For example, the electronic device architecture 1100 may be implemented as a single chip including the memory unit 1010, the ALU 1020, and the control unit 1030. Specifically, the memory unit 1010, the ALU 1020, and the control unit 1030 may be connected to each other through a metal line in an on-chip to communicate directly. The memory unit 1010, the ALU 1020, and the control unit 1030 may be monolithically integrated on one substrate to form a single chip. An input/output device 2000 may be connected to the electronic device architecture (chip) 1100.

The electronic device architecture 1100 may include at least one additional active device (e.g., another transistor and/or another diode), in addition to an array of unit cells 100. The unit cells 100 may be arranged in an array, such as in a content-addressable memory. Alternatively or additionally, the electronic device architecture 1100 may include at least one additional passive device (e.g., a resistor, a capacitor, an inductor, or a memristor), in addition to one or more unit cells 100.

The memory unit 1010, the ALU 1020, and the control unit 1030 may each independently include an array of unit cells 100 described above. For example, the ALU 1020 and the control unit 1030 may each independently include the unit cells 100 described above, and the memory unit 1010 may be or may include an array of the unit cells 100 described above, or a combination thereof. The memory unit 1010 may include both a main memory and a cache memory. The electronic device architecture (chip) 1100 may be or may include an on-chip memory processing unit.

Referring to FIG. 12, a cache memory 1510, an ALU 1520, and a control unit 1530 may constitute a central processing unit (CPU) 1500. The cache memory 1510 may be composed of a static random access memory (SRAM), and may include an array of unit cells 100 described above. Apart from the CPU 1500, a main memory 1600 and an auxiliary storage 1700 may be provided. At least one of the cache memory 1510, the ALU 1520, the control unit 1530, the CPU 1500, or main memory 1600 may be composed of a dynamic random access memory (DRAM) or may include an array of unit cells 100.

In some cases, the electronic device architecture 1100 may be implemented in a form in which computing unit devices and memory unit devices are adjacent to each other on a single chip, without division of sub-units.

In the disclosed non-volatile content addressable memory device, because a unit cell includes one NMOS ferroelectric transistor and one PMOS ferroelectric transistor, an element, such as an inverter provided in a unit cell of the related art is unnecessary or is not included, and thus, an area of the unit cell may be reduced compared to the conventional one. Accordingly, it may be possible to increase the degree of integration of the non-volatile content addressable memory device while simplifying the configuration and manufacturing process of the unit cell. Alternatively or additionally, because the same voltage is applied to the NMOS and PMOS ferroelectric transistors in a writing (record) operation and the search (read) operation, the operation may also be simplified.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that some example embodiments described herein should be considered in a descriptive sense only and not for purposes of limitation. Descriptions of features or aspects within each example embodiment should typically be considered as available for other similar features or aspects in other embodiments. No example embodiment is necessarily mutually exclusive with any other example embodiment. For example, some example embodiments may include features described with reference to one or more figures, and may also include features described with reference to one or more other figures. While one or more embodiments have been described with reference to the figures, it will be understood by those of ordinary skill in the art that various changes in form and details may be made therein without departing from the spirit and scope as defined by the following claims.

What is claimed is:

1. A non-volatile content addressable memory device comprising:
   a plurality of unit cells,
   wherein each of the plurality of unit cells includes,
      a first ferroelectric transistor, and
      a second ferroelectric transistor,
   wherein each of the first ferroelectric transistor and the second ferroelectric transistor comprises a ferroelectric layer,
   the first and second ferroelectric transistors are of different electrical types from each other, and
   each of the plurality of unit cells does not include another transistor,
   wherein the first ferroelectric transistor and the second ferroelectric transistor are connected to a search line, and
   wherein each of the plurality of unit cells is a 2T-OR-OC unit cell.

2. The non-volatile content addressable memory device of claim 1, wherein the first and second ferroelectric transistors are connected in series to each other or are connected in parallel to each other.

3. The non-volatile content addressable memory device of claim 1, wherein the first and second ferroelectric transistors share one word line and one match line.

4. The non-volatile content addressable memory device of claim 3, wherein the first and second ferroelectric transistors are both between the word line and the match line.

5. The non-volatile content addressable memory device of claim 3, wherein the first and second ferroelectric transistors share one search line.

6. The non-volatile content addressable memory device of claim 3, wherein one of the first and second ferroelectric transistors is connected to the search line and the other one of the first and second ferroelectric transistors is connected to a bar search line.

7. The non-volatile content addressable memory device of claim 1, wherein the first and second ferroelectric transistors share one match line, and the match line is connected between the first and second ferroelectric transistors.

8. The non-volatile content addressable memory device of claim 7, wherein one of the first and second ferroelectric transistors is connected to a word line.

9. The non-volatile content addressable memory device of claim 7, wherein the first and second ferroelectric transistors are connected to one search line.

10. A non-volatile wherein each of the first and second ferroelectric transistors comprises:
    a plurality of unit cells,
    wherein each of the plurality of unit cells includes,
    a first ferroelectric transistor, and
    a second ferroelectric transistor,
    wherein the first and second ferroelectric transistors are of different electrical types from each other, and
    each of the plurality of unit cells does not include another transistor,
    wherein each of the first and second ferroelectric transistors comprises:
       a substrate;
       first and second doped layers connected to the substrate and separated from each other;
       a ferroelectric layer on the substrate between the first doped layer and the second doped layer; and
       a gate layer on the ferroelectric layer.

11. The non-volatile content addressable memory device of claim 10, further comprising:
a paraelectric layer having no ferroelectric characteristics and arranged between the substrate and the ferroelectric layer.

12. The non-volatile content addressable memory device of claim 10, further comprising:
a channel layer between the substrate and the ferroelectric layer, wherein the first doped layer and the second doped layer are part of the channel layer.

13. The non-volatile content addressable memory device of claim 10, wherein the substrate includes at least one of a semiconductor layer, a two-dimensional material layer, or a quantum dot layer.

14. The non-volatile content addressable memory device of claim 10, wherein the ferroelectric layer includes at least one of an oxide layer without a dopant or an oxide layer including a dopant.

15. The non-volatile content addressable memory device of claim 1, wherein one of the first and second ferroelectric transistors is a PMOS transistor and the other one is an NMOS transistor.

16. An operating method of a non-volatile content addressable memory device comprising a plurality of unit cells, the operating method comprising:
applying an operating voltage to each of the unit cells,
wherein each of the plurality of unit cells includes two different electrical types of ferroelectric transistors,
each of the plurality of unit cells does not include another transistor,
wherein each of the two ferroelectric transistors comprises a ferroelectric layer,
wherein the two ferroelectric transistors are connected to a search line, and
wherein each of the plurality of unit cells is a 2T-OR-OC unit cell.

17. The operating method of claim 16, wherein the two ferroelectric transistors share a match line.

18. The operating method of claim 17,
wherein the two ferroelectric transistors share a word line, the two ferroelectric transistors are arranged between the match line and the word line, and a matching voltage is applied to the match line.

19. The operating method of claim 18, wherein the two ferroelectric transistors share the search line, and the applying the operating voltage comprises applying a search voltage to the search line.

20. The operating method of claim 18, wherein each of the unit cells is connected to the search line and a bar search line, and the applying the operating voltage comprises applying a search voltage to the search line and to the bar search line.

21. The operating method of claim 17, wherein the match line is connected between the two ferroelectric transistors, and a matching voltage is applied to the match line.

22. The operating method of claim 21, wherein the two ferroelectric transistors share the search line, and the applying the operating voltage comprises applying a search voltage via the search line.

23. The operating method of claim 16, wherein the operating voltage is a writing voltage.

24. The operating method of claim 23, further comprising:
applying a search voltage.

25. A non-volatile content addressable memory device comprising:
a plurality of unit cells,
wherein each of the plurality of unit cells is a 2T-OR-OC cell and includes,
a first ferroelectric transistor, and
a second ferroelectric transistor,
wherein a first gate length of the first ferroelectric transistor is different from a second gate length of the second ferroelectric transistor.

26. The non-volatile content addressable memory device of claim 25,
wherein the first ferroelectric transistor includes a first threshold adjust region having a first impurity concentration, and
the second ferroelectric transistor includes a second threshold adjust region having a second impurity concentration different from the first impurity concentration.

27. The non-volatile content addressable memory device of claim 25,
wherein the first ferroelectric transistor is configured to operate in an enhancement mode, and
the second ferroelectric transistor is configured to operate in a depletion mode.

28. The non-volatile content addressable memory device of claim 25, wherein the first and second ferroelectric transistors are of a same conductivity type.

* * * * *